(12) United States Patent
Nguyen et al.

(10) Patent No.: US 12,034,402 B2
(45) Date of Patent: *Jul. 9, 2024

(54) EXTERNAL ELECTRICAL CONTACT FOR SOLAR ROOF TILES

(71) Applicant: Tesla, Inc., Palo Alto, CA (US)

(72) Inventors: Peter P. Nguyen, Hayward, CA (US); Kaleb A. Klauber, Oakland, CA (US)

(73) Assignee: Tesla, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/381,557

(22) Filed: Jul. 21, 2021

(65) Prior Publication Data

US 2021/0351742 A1 Nov. 11, 2021

Related U.S. Application Data

(63) Continuation of application No. 16/051,029, filed on Jul. 31, 2018, now Pat. No. 11,082,005.

(51) Int. Cl.
*H02S 40/36* (2014.01)
*H02S 20/25* (2014.01)
*H02S 30/10* (2014.01)

(52) U.S. Cl.
CPC ............. *H02S 40/36* (2014.12); *H02S 20/25* (2014.12); *H02S 30/10* (2014.12)

(58) Field of Classification Search
CPC .......... H02S 40/36; H02S 20/25; H02S 30/10
See application file for complete search history.

(56) References Cited

U.S. PATENT DOCUMENTS 3,076,861 A 2/1963 Samulon et al.
3,369,939 A 2/1968 Myer
(Continued)

FOREIGN PATENT DOCUMENTS

CN 102544380 B 8/2015
CN 103426957 B 3/2016
(Continued)

OTHER PUBLICATIONS

"Commercial Electric Coaxial Cable Feed-Through Bushing on May 24, 2017", Home Depot, [online]. Retrieved from the Internet: <URL: https://web.archive.org/web/20170524222147/https://www.homedepot.com/p/Commercial-Electric-Coaxial-Cable-Feed-Through-Bushing-White-COAX-BUSH-WH/203717842> (Year: 2017).*

(Continued)

*Primary Examiner* — Tae-Sik Kang
(74) *Attorney, Agent, or Firm* — DLA Piper LLP (US)

(57) ABSTRACT

One embodiment can provide a photovoltaic roof tile module. The photovoltaic roof tile module can include a front cover, a back cover assembly, photovoltaic structures positioned between the front cover and back cover assembly, and an internal circuit component electrically coupled to the photovoltaic structures. The internal circuit component is positioned between the front cover and the back cover assembly. The back cover assembly can include at least one through hole and a metallic plug inserted inside the through hole. A first surface of the metallic plug can electrically couple to the internal circuit component, and a second opposite surface of the metallic plug can be exposed to surroundings external to the photovoltaic roof tile module, thereby facilitating electrical coupling between the photovoltaic roof tile module and another photovoltaic roof tile module.

15 Claims, 18 Drawing Sheets

(56) References Cited

U.S. PATENT DOCUMENTS

| | | |
|---|---|---|
| 3,461,602 A | 8/1969 | Hasel et al. |
| 4,239,810 A | 12/1980 | Alameddine et al. |
| 4,724,011 A | 2/1988 | Turner et al. |
| 5,118,540 A | 6/1992 | Hutchison |
| 5,338,369 A | 8/1994 | Rawlings |
| 5,427,961 A | 6/1995 | Takenouchi et al. |
| 5,667,596 A | 9/1997 | Tsuzuki et al. |
| 5,942,048 A | 8/1999 | Fujisaki et al. |
| 6,133,522 A | 10/2000 | Kataoka et al. |
| 6,311,436 B1 | 11/2001 | Mimura et al. |
| 6,365,824 B1 | 4/2002 | Nakazima et al. |
| 6,472,594 B1 | 10/2002 | Ichinose et al. |
| 6,586,271 B2 | 7/2003 | Hanoka |
| 6,960,716 B2 | 11/2005 | Matsumi et al. |
| 7,259,321 B2 | 8/2007 | Oswald et al. |
| 7,276,724 B2 | 10/2007 | Sheats et al. |
| 7,506,477 B2 | 3/2009 | Flaherty et al. |
| 7,534,956 B2 | 5/2009 | Kataoka et al. |
| 7,772,484 B2 | 8/2010 | Li et al. |
| 7,833,808 B2 | 11/2010 | Xu et al. |
| 7,851,700 B2 | 12/2010 | Luch |
| 7,858,874 B2 | 12/2010 | Ruskin et al. |
| 7,902,451 B2 | 3/2011 | Shimizu |
| 7,964,440 B2 | 6/2011 | Salleo et al. |
| 8,205,400 B2 | 6/2012 | Allen |
| 8,206,664 B2 | 6/2012 | Lin |
| 8,276,329 B2 | 10/2012 | Lenox |
| 8,471,141 B2 | 6/2013 | Stancel et al. |
| 8,664,030 B2 | 3/2014 | Luch |
| 8,674,377 B2 | 3/2014 | Farquhar |
| 8,701,360 B2 | 4/2014 | Ressler |
| 8,713,861 B2 | 5/2014 | Desloover |
| 8,822,810 B2 | 9/2014 | Luch |
| 9,038,330 B2 | 5/2015 | Bellavia |
| 9,150,966 B2 | 10/2015 | Xu et al. |
| 9,206,520 B2 | 12/2015 | Barr et al. |
| 9,343,592 B2 | 5/2016 | Hunt |
| 9,362,527 B2 | 6/2016 | Takemura |
| 9,412,884 B2 | 8/2016 | Heng et al. |
| 9,412,890 B1 | 8/2016 | Meyers |
| 9,525,092 B2 | 12/2016 | Mayer et al. |
| 9,825,582 B2 | 11/2017 | Fernandes et al. |
| 9,899,554 B2 | 2/2018 | Yang et al. |
| 9,966,487 B2 | 5/2018 | Magnusdottir et al. |
| 2001/0054435 A1 | 12/2001 | Nagao et al. |
| 2002/0015782 A1 | 2/2002 | Abys et al. |
| 2003/0180983 A1 | 9/2003 | Oswald et al. |
| 2004/0261840 A1 | 12/2004 | Schmit et al. |
| 2005/0039788 A1 | 2/2005 | Blieske et al. |
| 2005/0268963 A1 | 12/2005 | Jordan et al. |
| 2006/0048798 A1 | 3/2006 | McCoy et al. |
| 2006/0086620 A1 | 4/2006 | Chase et al. |
| 2006/0204730 A1 | 9/2006 | Nakamura et al. |
| 2008/0135085 A1 | 6/2008 | Corrales et al. |
| 2009/0101192 A1 | 4/2009 | Kothari et al. |
| 2009/0120497 A1 | 5/2009 | Schetty, III |
| 2009/0133739 A1 | 5/2009 | Shiao et al. |
| 2009/0133740 A1 | 5/2009 | Shiao et al. |
| 2009/0233083 A1 | 9/2009 | Inoue et al. |
| 2009/0242021 A1 | 10/2009 | Petkie et al. |
| 2009/0287446 A1 | 11/2009 | Wang et al. |
| 2009/0308435 A1 | 12/2009 | Caiger |
| 2010/0000603 A1 | 1/2010 | Tsuzuki et al. |
| 2010/0006147 A1 | 1/2010 | Nakashima et al. |
| 2010/0018568 A1 | 1/2010 | Nakata |
| 2010/0132762 A1 | 6/2010 | Graham et al. |
| 2010/0147363 A1 | 6/2010 | Huang et al. |
| 2010/0175743 A1* | 7/2010 | Gonzalez ............ H01L 31/049 |
| | | 136/251 |
| 2010/0180929 A1 | 7/2010 | Raymond et al. |
| 2011/0023937 A1 | 2/2011 | Daniel et al. |
| 2011/0023942 A1 | 2/2011 | Soegding et al. |
| 2011/0030761 A1 | 2/2011 | Kalkanoglu et al. |
| 2011/0277825 A1 | 11/2011 | Fu et al. |
| 2011/0308566 A1* | 12/2011 | Johnson ................ H02S 40/34 |
| | | 136/244 |
| 2012/0012162 A1 | 1/2012 | Kobayashi |
| 2012/0031470 A1 | 2/2012 | Dimov et al. |
| 2012/0048349 A1 | 3/2012 | Metin et al. |
| 2012/0060911 A1 | 3/2012 | Fu et al. |
| 2012/0125391 A1 | 5/2012 | Pinarbasi et al. |
| 2012/0199184 A1 | 8/2012 | Nie et al. |
| 2012/0237670 A1 | 9/2012 | Lim et al. |
| 2013/0048062 A1 | 2/2013 | Min et al. |
| 2013/0061913 A1 | 3/2013 | Willham et al. |
| 2013/0160823 A1 | 6/2013 | Khouri et al. |
| 2013/0206213 A1 | 8/2013 | He et al. |
| 2013/0209776 A1 | 8/2013 | Kim |
| 2013/0233378 A1 | 9/2013 | Moslehi et al. |
| 2013/0247959 A1 | 9/2013 | Kwon et al. |
| 2013/0255755 A1 | 10/2013 | Chich |
| 2013/0280521 A1 | 10/2013 | Mori |
| 2014/0120699 A1 | 5/2014 | Hua et al. |
| 2014/0124014 A1 | 5/2014 | Morad et al. |
| 2014/0196768 A1 | 7/2014 | Heng et al. |
| 2014/0313574 A1 | 10/2014 | Bills et al. |
| 2014/0326295 A1 | 11/2014 | Moslehi |
| 2014/0360582 A1 | 12/2014 | Cui et al. |
| 2015/0090314 A1 | 4/2015 | Yang et al. |
| 2015/0155824 A1 | 6/2015 | Chien |
| 2015/0194552 A1 | 7/2015 | Ogasahara et al. |
| 2015/0243931 A1 | 8/2015 | Fukuura |
| 2015/0270410 A1 | 9/2015 | Heng et al. |
| 2015/0349145 A1 | 12/2015 | Morad et al. |
| 2015/0349152 A1 | 12/2015 | Voss et al. |
| 2015/0349703 A1 | 12/2015 | Morad et al. |
| 2016/0013329 A1 | 1/2016 | Brophy et al. |
| 2016/0013335 A1 | 1/2016 | Moslehi et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0225931 A1 | 8/2016 | Heng et al. |
| 2016/0300968 A1 | 10/2016 | Baccini et al. |
| 2017/0033250 A1 | 2/2017 | Ballif et al. |
| 2017/0077343 A1 | 3/2017 | Morad et al. |
| 2017/0194516 A1 | 7/2017 | Reddy et al. |
| 2017/0222082 A1 | 8/2017 | Lin et al. |
| 2018/0166601 A1 | 6/2018 | Inaba |
| 2018/0366597 A1 | 12/2018 | Carlson et al. |
| 2020/0044601 A1 | 2/2020 | Nguyen et al. |

FOREIGN PATENT DOCUMENTS

| | | |
|---|---|---|
| CN | 102956730 B | 6/2016 |
| DE | 102007054124 A1 | 5/2009 |
| EP | 1058320 A2 | 12/2000 |
| EP | 2051124 A2 | 4/2009 |
| EP | 2709160 A2 | 3/2014 |
| GB | 2278618 A | 12/1994 |
| JP | 57-141979 A | 9/1982 |
| JP | 60-20586 A | 2/1985 |
| JP | 6-140657 A | 5/1994 |
| JP | 6-264571 A | 9/1994 |
| JP | 2000-91610 A | 3/2000 |
| JP | 2000-216415 A | 8/2000 |
| JP | 2013-211385 A | 10/2013 |
| WO | 2008/136872 A2 | 11/2008 |
| WO | 2009/062106 A1 | 5/2009 |
| WO | 2009/099418 A2 | 8/2009 |
| WO | 2010/128375 A2 | 11/2010 |
| WO | 2011/128757 A1 | 10/2011 |
| WO | 2013/059441 A1 | 4/2013 |
| WO | 2013/067541 A1 | 5/2013 |
| WO | 2013/102181 A1 | 7/2013 |
| WO | 2014/178180 A1 | 11/2014 |
| WO | 2015/155356 A1 | 10/2015 |

(56) References Cited

FOREIGN PATENT DOCUMENTS

| WO | 2016/090341 A1 | 6/2016 |
|---|---|---|
| WO | 2017/102669 A1 | 6/2017 |

OTHER PUBLICATIONS

International Preliminary Report on Patentability received for PCT Patent Application No. PCT/US2019/044316, dated Feb. 11, 2021, 7 pages.

International Search Report and Written Opinion received for PCT Patent Application No. PCT/US2019/044316, dated Oct. 14, 2019, 8 pages.

Balucani et al., "A new approach: low cost masking material and efficient copper metallization for higher efficiency silicon solar cells", IEEE, 2015, 6 pages.

Fan et al., "Laser micromachined wax-covered plastic paper as both sputter deposition shadow masks and deep-ultraviolet patterning masks for polymethylmacrylate-based microfluidic systems", vol. 12, No. 4, Journal of Micro/ Nanolithography, MEMS, and MOEMS, Dec. 16, 2013, pp. 1-6.

Non-Final Office Action received for U.S. Appl. No. 16/051,029, dated Sep. 30, 2020, 13 pages.

Notice of Allowance received for U.S. Appl. No. 16/051,029, dated Mar. 26, 2021, 7 pages.

Pelisset et al., "Efficiency of Silicon Thin-Film Photovoltaic Modules with a Front Coloured Glass", Proceeding of the CISBAT International Conference, 2011, 6 pages.

Poole et al., "Recovery Act: Organic Coatings as Encapsulants for Low Cost, High Performance PV Modules", Final Technical Report, PPG Industries Inc., Nov. 16, 2011, 35 pages.

Vyas et al., "An Inorganic/Organic Hybrid Coating for Low Cost Metal Mounted Dye-Sensitized Solar Cells", 223rd ECS Meeting, The Electrochemical Society, 2013, 1 page.

Office Action received for European Patent Application No. 19752828.4, dated Sep. 14, 2022, 5 pages.

* cited by examiner

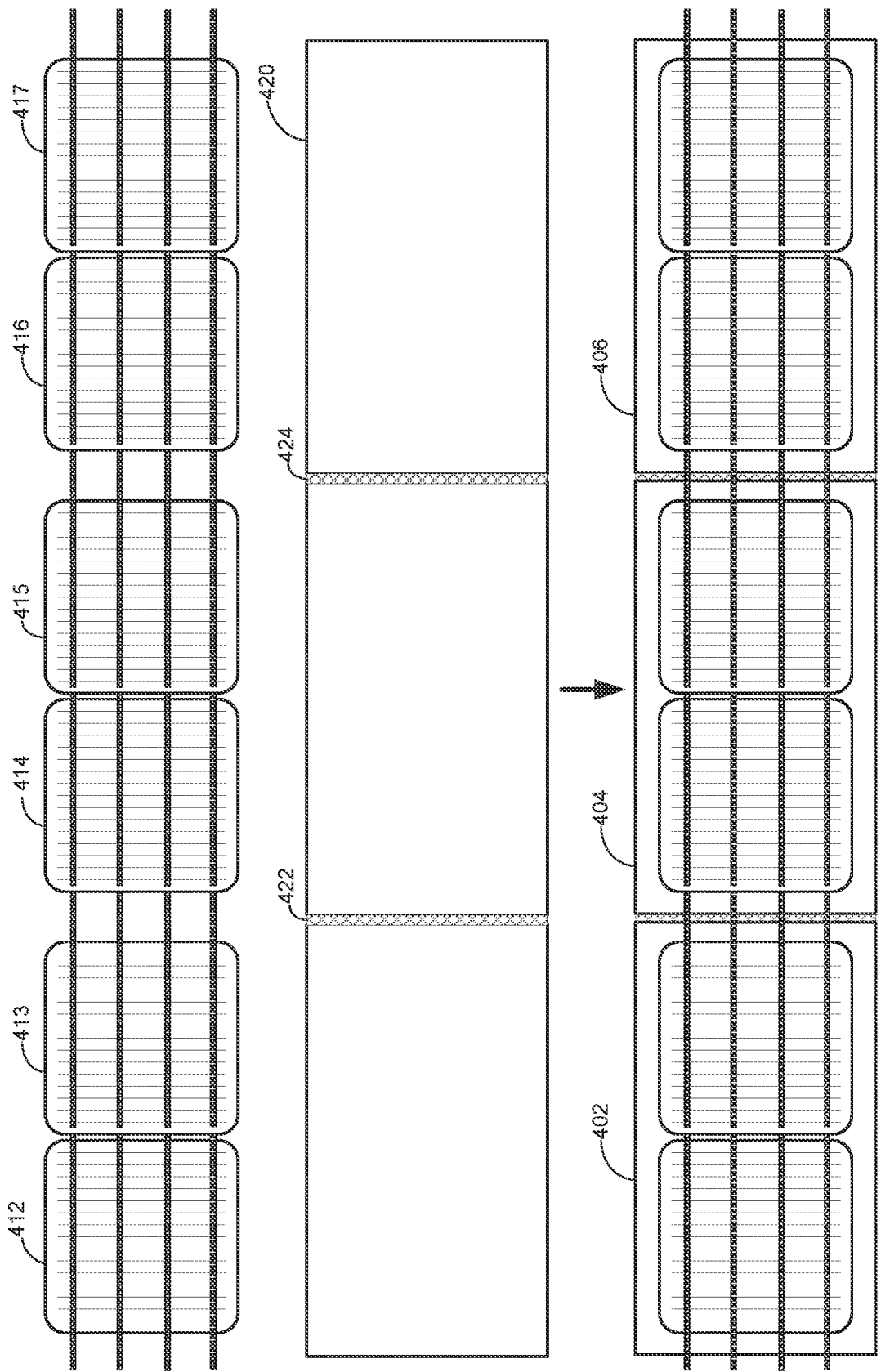

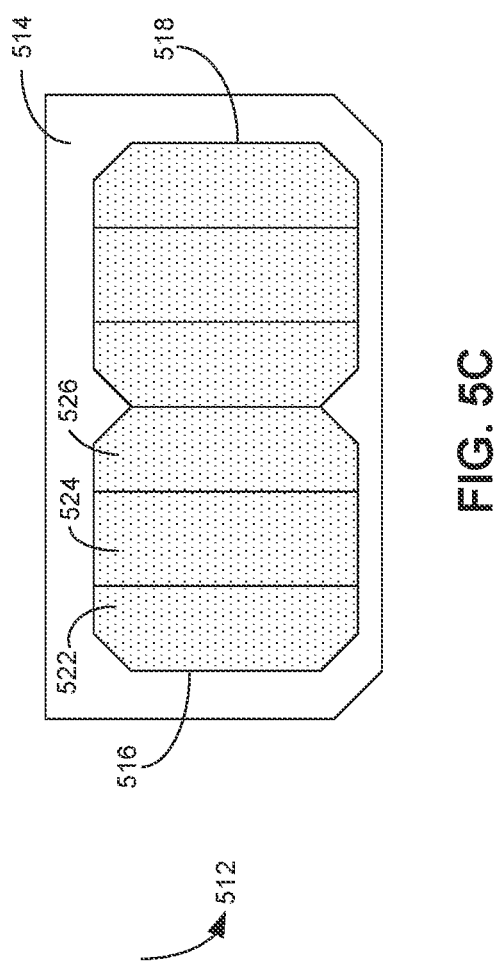

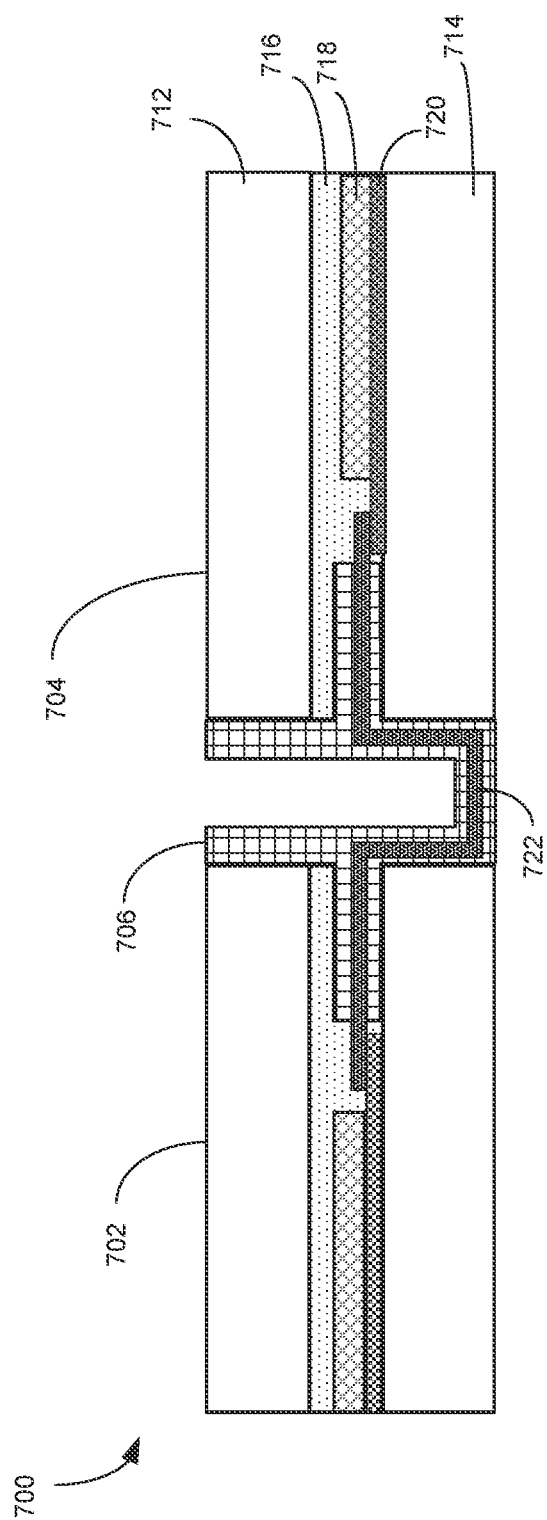

EXTERNAL ELECTRICAL CONTACT FOR SOLAR ROOF TILES

CROSS REFERENCE TO RELATED APPLICATION

This application is a continuation of U.S. Non-Provisional patent application Ser. No. 16/051,029 filed on Jul. 31, 2018, the disclosure of which is hereby incorporated by reference in its entirety and for all purposes.

BACKGROUND

Field

This disclosure is generally related to photovoltaic (or "PV") roof tile modules. More specifically, this disclosure is related to roof tile modules with external electrical connectors.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically encloses fewer solar cells than a conventional solar panel.

The front and back covers can be fortified glass or other material that can protect the PV cells from the weather elements. Note that a typical roof tile may have a dimension of 15 in×8 in=120 $in^2$=774 $cm^2$, and a typical solar cell may have a dimension of 6 in×6 in=36 $in^2$=232 $cm^2$. Similar to a conventional PV panel, the PV roof tile can include an encapsulating layer, such as an organic polymer. A lamination process can seal the solar cells between the front and back covers.

To facilitate scalable production and easy installation of PV roof tiles, a group of tiles can be fabricated together as a single module. Like conventional PV panels, electrical interconnections among PV modules are needed.

SUMMARY

One embodiment can provide a photovoltaic roof tile module. The photovoltaic roof tile module can include a front glass cover, a back glass cover, a plurality of photovoltaic structures positioned between the front and back glass covers, and an internal circuit component electrically coupled to the plurality of photovoltaic structures. The internal circuit component is positioned between the front and back glass covers. The back glass cover can include at least one through hole and a metallic plug inserted inside the through hole. A first surface of the metallic plug can electrically couple to the internal circuit component, and a second opposite surface of the metallic plug can be exposed to surroundings external to the photovoltaic roof tile module, thereby facilitating electrical coupling between the photovoltaic roof tile module and another photovoltaic roof tile module.

In a variation on this embodiment, a respective photovoltaic structure can include a first edge busbar positioned near an edge of a first surface and a second edge busbar positioned near an opposite edge of a second surface. The plurality of photovoltaic structures can be arranged in such a way that the first edge busbar of a first photovoltaic structure overlaps the second edge busbar of an adjacent photovoltaic structure, thereby forming a cascaded string that includes the plurality of photovoltaic structures coupled to each other in series.

In a further variation, the internal circuit component can include one of: a standalone metallic strip electrically coupled to an edge busbar of the cascaded string, or a metallic strip pre-laid onto an interior surface of the back glass cover.

In a variation on this embodiment, the second opposite surface of the metallic plug can be flush with an exterior surface of the back glass cover.

In a variation on this embodiment, the first surface of the metallic plug can be in direct contact with the internal circuit component.

In a further variation, the first surface of the metallic plug can be textured to ensure a sufficient contact area between the first surface of the metallic plug and the internal circuit component.

In a variation on this embodiment, the photovoltaic roof tile module can further include a gasket inserted inside the through hole, and the metallic plug can be inserted inside a center opening of the gasket.

In a further variation, the metallic plug can be configured in such a way that a portion of the metallic plug is slightly larger than the center opening, thus preventing the metallic plug from slipping through the center opening.

In a variation on this embodiment, the photovoltaic roof tile module can further include a junction box attached to the back glass cover. The junction box covers the through hole and includes a lead wire coupled to the second opposite surface of the metallic plug.

In a variation on this embodiment, the metallic plug can include Cu.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

FIG. 4A illustrates an exemplary configuration of a multi-tile module, according to one embodiment.

FIG. 5C illustrates an exemplary solar roof tile, according to one embodiment.

FIG. 7 shows a partial cross-sectional view of a multi-tile module, according to one embodiment

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the invention solve at least the technical problem of enabling low-cost and reliable electrical interconnections among solar roof tile modules. More specifically, each solar roof tile module can include, on its back cover, two external electrical contacts, one for each polarity. In some embodiments, an external electrical contact can be in the form of a metallic plug inserted inside a through hole formed on the back cover of the tile module. In some embodiments, a surface of the metallic plug can be textured to ensure reliable electrical coupling between the metallic plug and the internal electrical contacts of the tile module. Moreover, the other surface of the metallic plug can be substantially on the same plane as the exterior surface of the back cover, thus enabling a simplified electrical coupling between the metallic plug and a junction box attached to the back cover.

PV Roof Tiles and Multi-Tile Modules

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

Figure 1:
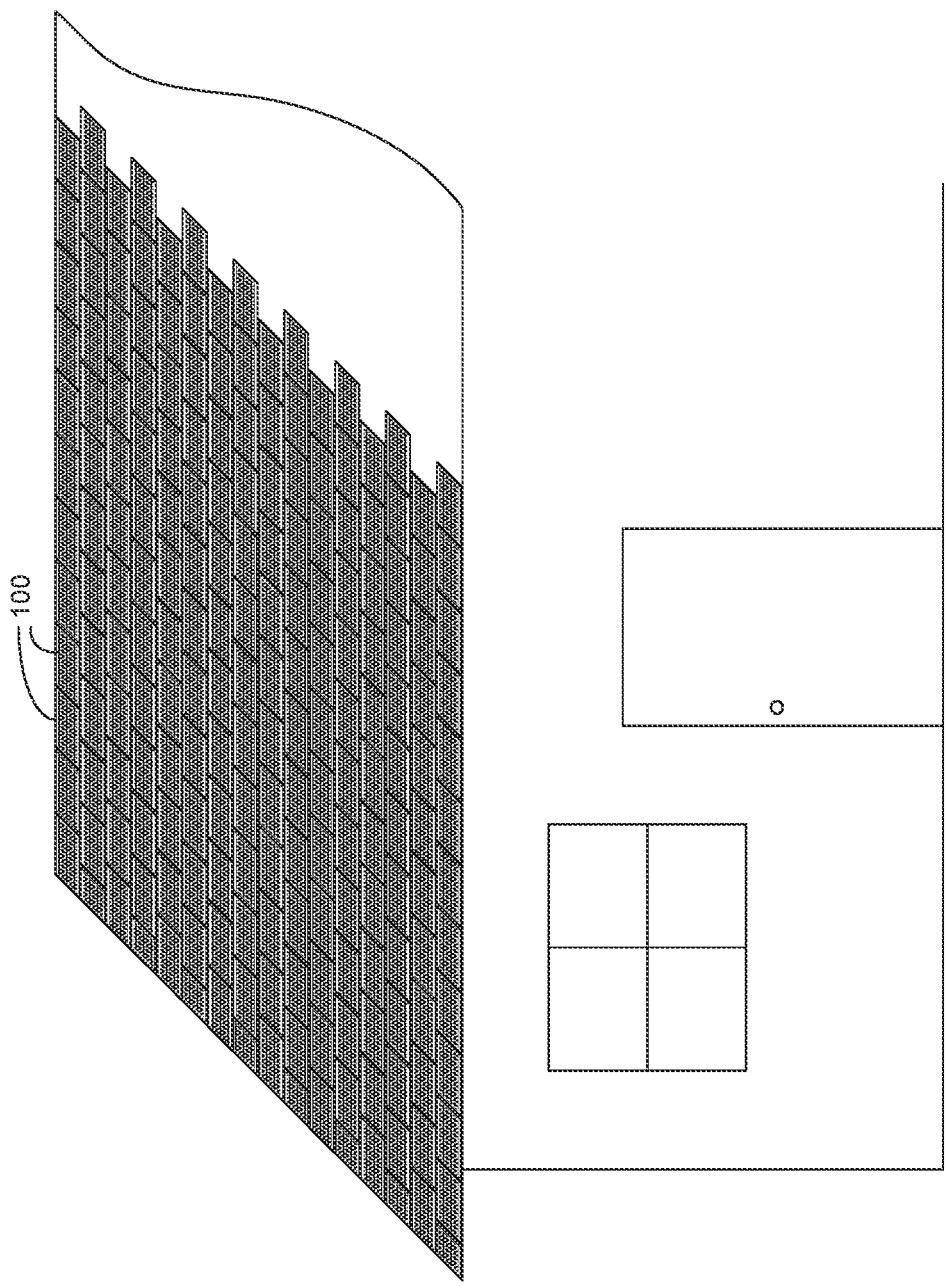
FIG. 1 shows an exemplary configuration of PV roof tiles on a house.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes, such as busbars and finger lines. The PV structures within a PV roof tile can be electrically and, optionally, mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
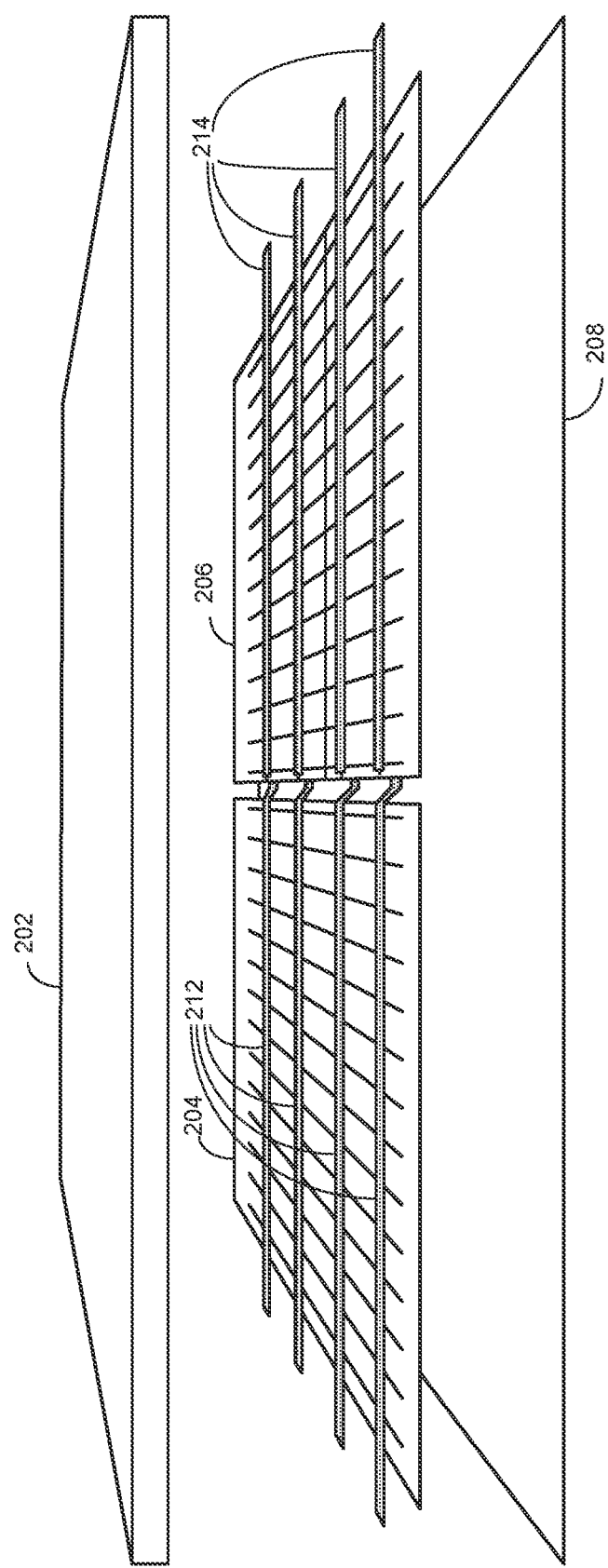
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 3:
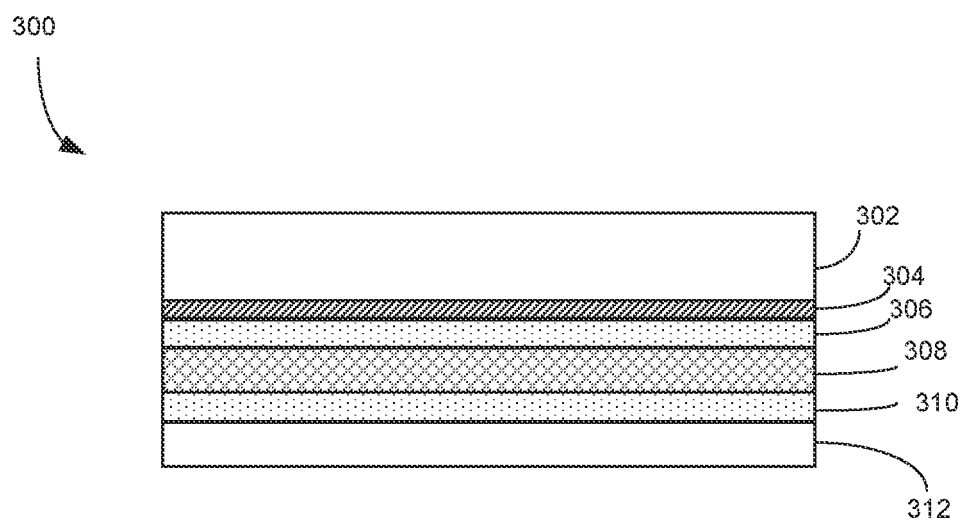
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the number of tiles included in each multi-tile module can be more or fewer than what is shown in FIG. 4A.

Figure 4B:
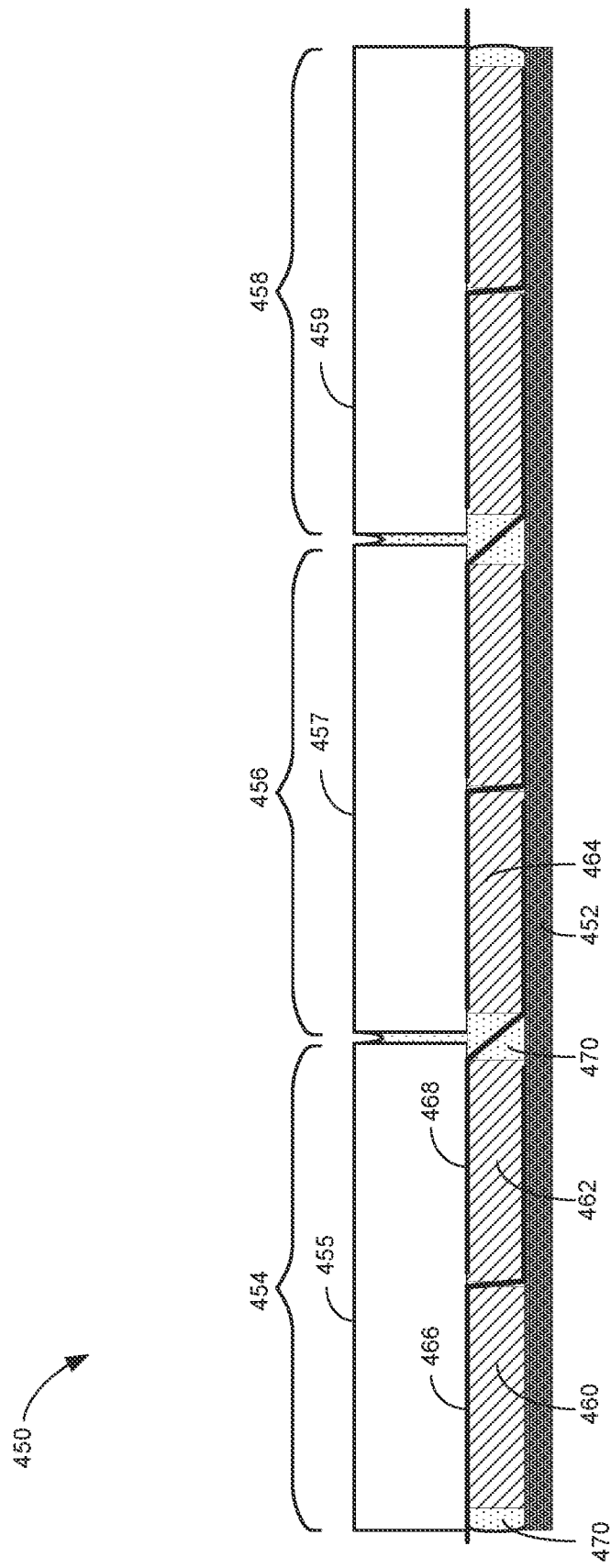
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 466 can couple the front electrode of solar cell 460 to the back electrode of solar cell 462, creating a serial connection between these two cells. Similarly, tabbing strip 468 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 468 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 5A:
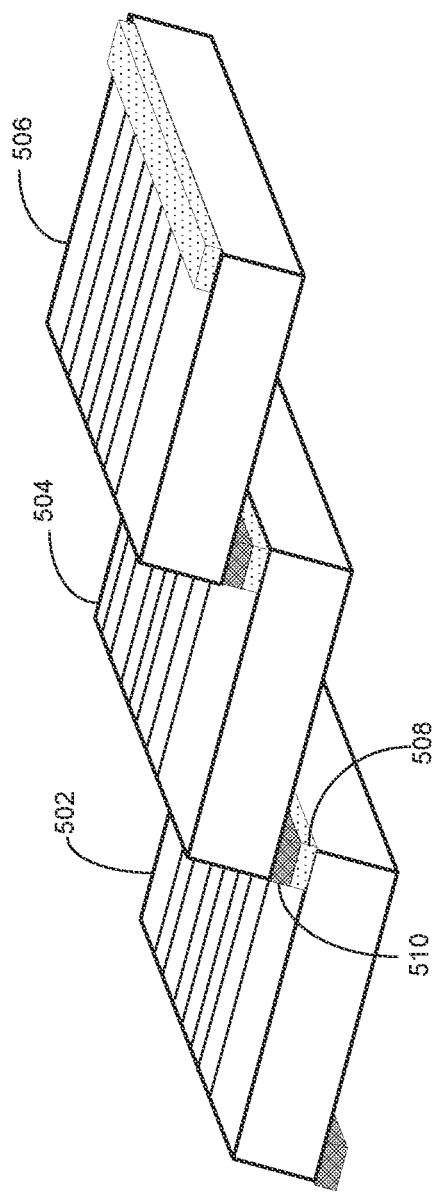
FIG. 5A illustrates a serial connection among three adjacent cascaded photovoltaic strips, according to one embodiment.

FIG. 5A illustrates a serial connection among three adjacent cascaded photovoltaic strips, according to one embodiment. In FIG. 5A, strips 502, 504, and 506 are stacked in such a way that strip 504 partially underlaps adjacent strip 506 to its right, and overlaps strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

Figure 5B:
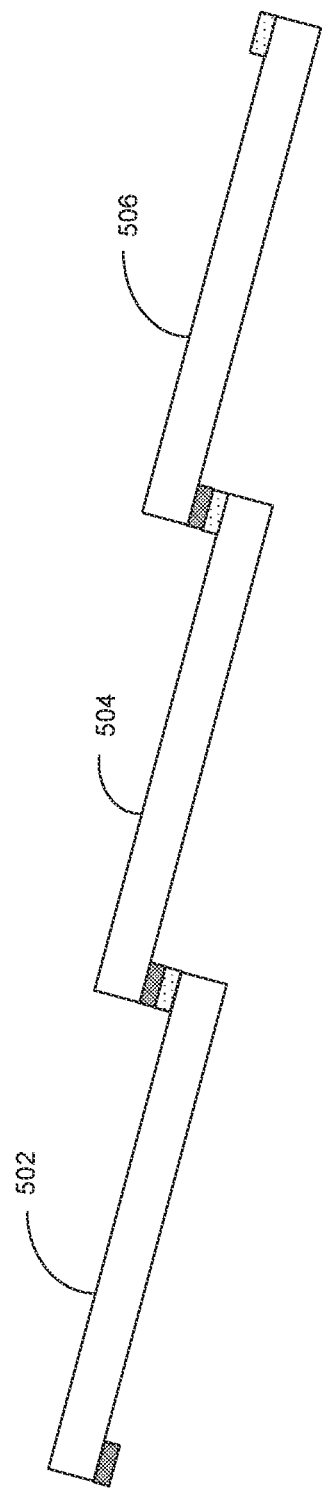
FIG. 5B illustrates the side view of the string of cascaded strips, according to one embodiment.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a serially connected string, and a number of strings can be coupled in series or parallel.

FIG. 5C illustrates an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

In some embodiments, multiple solar roof tiles, each encapsulating a cascaded string, can be assembled together to obtain a multi-tile module. Inner-tile electrical coupling has been accomplished by overlapping corresponding edge busbars of adjacent strips, similar to the examples shown in FIGS. 5A-5B. Moreover, inter-tile electrical coupling within such a multi-tile module can be accomplished using either long bussing strips or an embedded circuit attached to the back cover of the multi-tile module.

Figure 6:
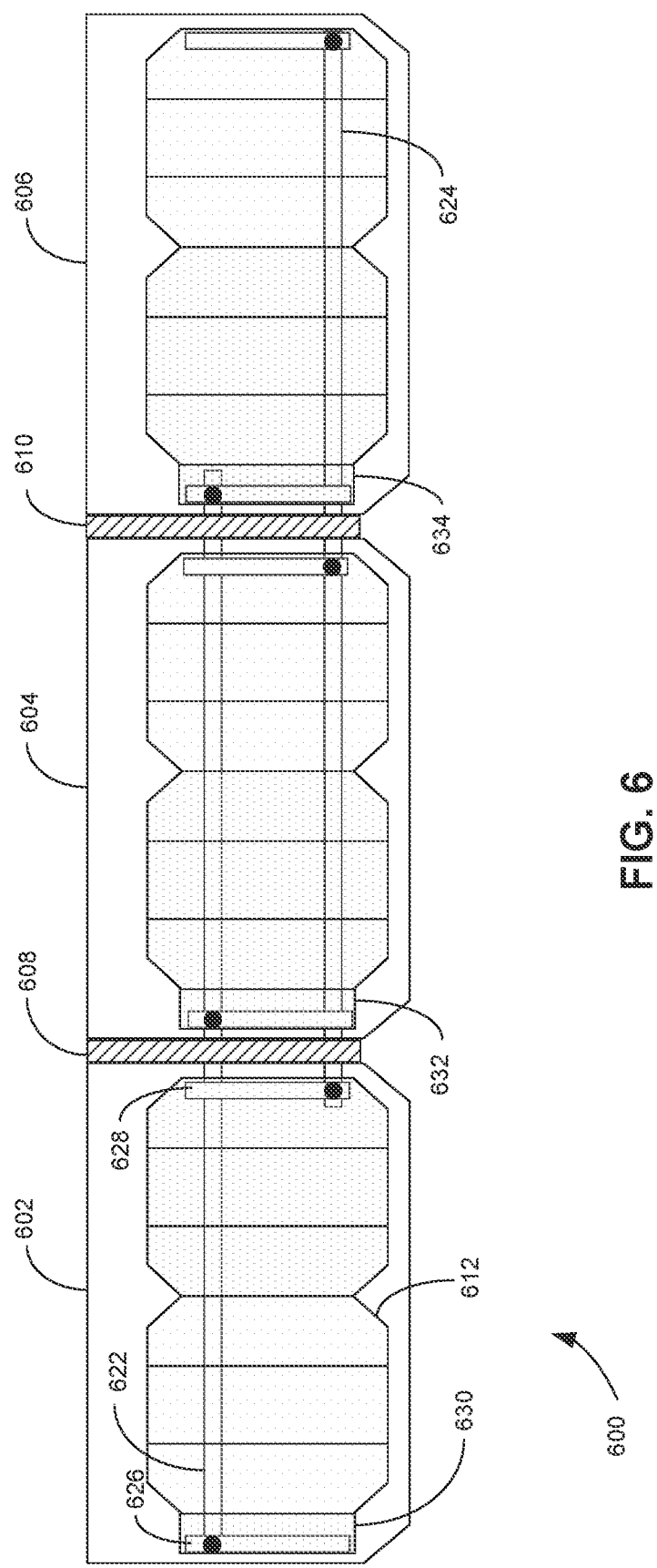
FIG. 6 illustrates the front view of an exemplary fabricated multi-tile module with embedded circuit, according to one embodiment.

FIG. 6 illustrates the front view of an exemplary fabricated multi-tile module with embedded circuit, according to one embodiment. Multi-tile module 600 can include a number of tiles (e.g., tiles 602, 604, and 606) that are placed adjacent to each other in the lateral direction, with neighboring tiles being mechanically coupled to each other via a tile spacer. For example, tile spacer 608 mechanically couples tiles 602 and 604, and tile spacer 610 mechanically couples tiles 604 and 606. Each tile can include a cascaded string of photovoltaic structures encapsulated between front and back covers. For example, tile 602 can include cascaded string 612. Note that the photovoltaic structures within each cascaded string are also arranged to be adjacent to one another in the lateral direction.

In some embodiments, each tile can also include a Si-based bridge electrode (e.g., bridge electrodes 630, 632, and 634) attached to an edge of the cascaded string. More specifically, the Si-based bridge electrode can include a metallic layer covering its entire back surface and, optionally, a back edge busbar. By overlapping its edge (e.g., back edge busbar) with the front edge busbar of the cascaded string, the Si-based bridge electrode can turn itself into an electrode for the cascaded string, converting the forwardly facing electrode of the cascaded string to an electrode accessible from the back side of the cascaded string. Detailed descriptions of the Si-based bridge electrode can be found in U.S. patent application Ser. No. 16/006,645, filed Jun. 12, 2018, and entitled "SOLAR ROOF TILE CONNECTORS," the disclosure of which is incorporated herein by reference in its entirety. In alternative embodiments, bridge electrodes 630, 632, and 634 can include simple metal tabs coupled to the front edge busbar of each cascaded string.

Each tile can include a front tile cover and a front encapsulant layer, which are transparent and are not labeled in FIG. 6. For illustration purposes, the cascaded strings (e.g., cascaded string 612) can be shown as semi-transparent to reveal the pre-laid circuit on the back covers of the tiles. The pre-laid circuit can include a number of metallic strips or traces that have been directly deposited onto the interior surface of the back covers. In the example shown in FIG. 6, the pre-laid circuit includes two cross-tile metallic strips (e.g., metallic strips 622 and 624) that run across multiple tiles in the lateral direction. The pre-laid circuit can also include a number of metallic strips or traces that run in the vertical direction (e.g., metallic strips 626 and 628). These vertical metallic strips or traces underlap the bottom edge busbar of the cascaded strings and the contact pads of the bridge electrodes (e.g., bridge electrodes 630, 632, and 634). For example, vertical metallic strip 626 underlaps contact pads of bridge electrode 630, and vertical metallic strip 628 underlaps the bottom edge busbar of cascaded string 612.

In the example shown in FIG. 6, the pre-laid circuit facilitates in-parallel electrical connections among the cascaded strings. In practice, the pre-laid circuit can be configured differently, depending on the need. For example, the coupling between the lateral cross-tile metallic strips and the vertical metallic strips can be configured in such a way that they facilitate in-series electrical connections among the cascaded string. Alternatively, a combination of in-parallel and in-series electrical connections can also be achieved within a same multi-tile module. Detailed descriptions of the pre-laid circuit can be found in U.S. patent application Ser. No. 16/023,480, filed Jun. 29, 2018, and entitled "SOLAR ROOF TILE MODULE WITH EMBEDDED INTER-TILE CIRCUITRY," the disclosure of which is incorporated herein by reference in its entirety.

As one can see in FIG. 6, the pre-laid circuit can almost completely hide underneath the cascaded string, thus eliminating the need for color-matching between the pre-laid circuit and the cascaded strings. Moreover, pre-laying the electrical circuit onto the back glass cover can provide a more streamlined fabrication process. However, to facilitate electrical coupling between the pre-laid circuits of adjacent solar tiles, a specially designed tile spacer is needed. In some embodiments, a tile spacer can include a thermal plastic body and one or more metallic strips embedded within the thermal plastic body, as shown in FIG. 7.

FIG. 7 shows a partial cross-sectional view of a multi-tile module, according to one embodiment. Multi-tile module 700 includes solar roof tiles 702 and 704 coupled to each other by tile spacer 706. Each solar roof tile (e.g., solar roof tile 704) can include a front cover 712, a back cover 714, an encapsulant layer 716, a cascaded string 718, and a pre-laid circuit 720. More specifically, pre-laid circuit 720 is attached to back cover 714 and electrically coupled to cascaded string 718.

Tile spacer 706 can include a circuit component 722 embedded inside its body, including both a base section and two wing sections. In some embodiments, circuit component 722 can include one or more metallic strips. As shown in FIG. 7, edges of embedded circuit component 722 can extend beyond the edges of the wings of tile spacer 706 to come into contact with the pre-laid circuit (e.g., pre-laid circuit 720) within each solar roof tile. As a result, electrical coupling can be established between the cascaded strings within the adjacent solar roof tiles. Depending on the configurations of the pre-laid circuits within each tile and circuit component 722, in-series or in-parallel coupling between the cascaded strings can be achieved.

Detailed descriptions of the Si-based bridge electrode can be found in U.S. patent application Ser. No. 16/050,994, filed Jul. 31, 2018, and entitled "SOLAR ROOF TILE SPACER WITH EMBEDDED CIRCUITRY," the disclosure of which is incorporated herein by reference in its entirety.

External Contacts for Inter-Module Connection

Figure 8A:
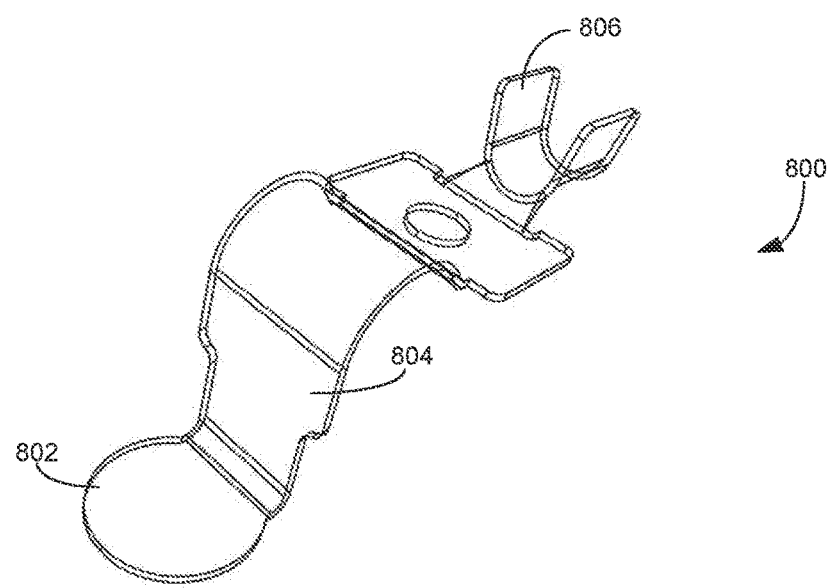
FIG. 8A shows a specially designed attachment pad, according to one embodiment.
Figure 8B:
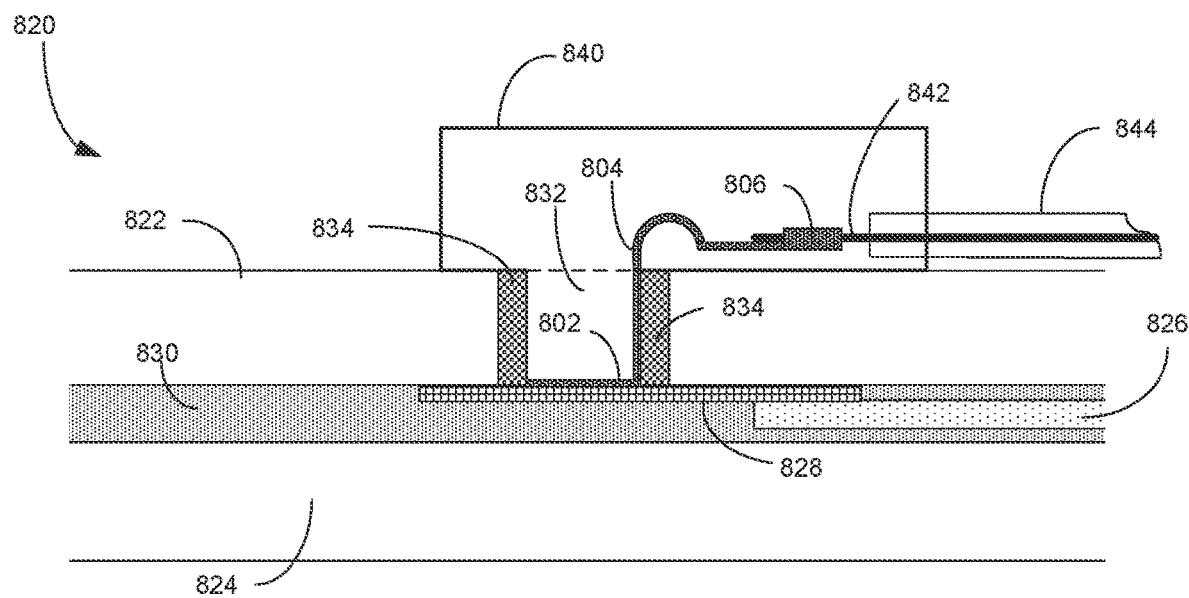
FIG. 8B shows the coupling between the attachment pad and the internal circuit of a solar tile module, according to one embodiment.

Because the photovoltaic structures and the inner- and inter-tile electrical interconnects (e.g., the pre-laid and embedded circuit components) are encapsulated between the front and back covers of the solar tiles, external lead wires are needed to facilitate inter-module electrical interconnections. In conventional PV panels, external lead wires may access the solar cell electrodes via pre-cut slots at the back side of the PV panel. For example, bussing ribbons may reach, through pre-cut slots on the PV panel backsheet, a junction box attached to the back side of the PV panel. Similar approaches may be used in solar roof tiles or tile modules. For example, pre-cut holes can be created on the back cover of a solar roof tile module to expose the internal circuit, and specially designed attachment pads can be used to establish electrical contact with the internal circuit. FIG. 8A shows a specially designed attachment pad, according to one embodiment. FIG. 8B shows the coupling between the attachment pad and the internal circuit of a solar tile module, according to one embodiment.

In FIG. 8A, attachment pad 800 can include a flat piece (or a contact pad) 802, extension post 804, and wire coupler 806. In FIG. 8B, PV tile module 820 can include back cover 822, front cover 824, and cascaded string 826 encapsulated between back cover 822 and front cover 824. Internal pre-laid circuit 828 is attached to back cover 822 and electrically coupled to cascaded string 826. The attachment pad can be inserted into through hole 832 on back cover 822 such that contact pad 802 can be in contact with pre-laid circuit 828. PV roof tile module 820 can also include encapsulant 830 sandwiched between back cover 822 and front cover 824, and gasket 834 placed inside through hole 832. Gasket 834 can prevent encapsulant 830 from over-flowing into through hole 832 during lamination. In addition to using a pre-laid circuit for the inter-tile electrical coupling, it is also possible to use standalone metallic strips to achieve inter-tile coupling. In such a scenario, the attachment pad will couple to a corresponding standalone metallic strip.

A junction box 840 can be placed on back cover 822, directly above through hole 832. Wire coupler 806 of the attachment pad can be coupled to a lead wire 842 inside junction box 840. Weatherproof jacket 844 can protect lead wire 842 from weather elements. Lead wire 842 can extend out of junction box 840 to be coupled to lead wires from other PV tile modules to achieve inter-module electrical coupling.

Detailed descriptions of the junction box and attachment pad can be found in U.S. patent application Ser. No. 15/905,551, filed Feb. 26, 2018, and entitled "SYSTEM AND METHOD FOR COUPLING JUNCTION BOX TO SOLAR ROOF TILES," the disclosure of which is incorporated herein by reference in its entirety.

Although the specially designed attachment pad can facilitate inter-module electrical coupling, fabricating the attachment pad can be an expensive process and inserting the attachment pad into the back-cover through hole can be cumbersome. A simpler mechanism that can facilitate inter-module electrical coupling is needed.

In some embodiments, instead of the specially designed attachment pad, a metallic plug and a gasket can together form an external electrical contact for a PV roof tile module to allow for simple and reliable inter-module electrical coupling.

Figure 9A:
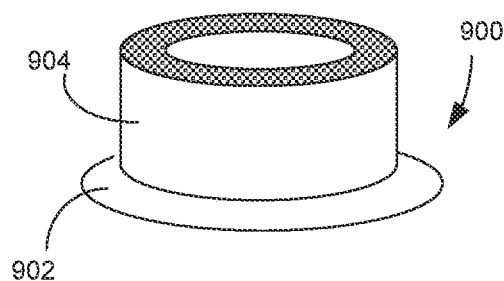
FIG. 9A shows an exemplary gasket, according to one embodiment.

FIG. 9A shows an exemplary gasket, according to one embodiment. Gasket 900 can include a base 902 and a body 904 positioned above base 902. Both base 902 and body 904 can be ring shaped. More specifically, the inner diameters of base 902 and body 904 can be the same, and the outer diameter of base 902 can be larger than that of body 904. Moreover, the height of body 904 can be much larger than the height of base 902. In some embodiments, the height of body 904 can be similar to the thickness of the back cover of the tile module. This way, when the gasket is inserted into the through hole on the back cover of the tile module, the upper surface of body 904 can be substantially aligned to the exterior surface of the back cover. Depending on the thickness of the back cover, the height of body 904 can be between 0.5 and 5 mm. On the other hand, the thickness of base 902 can be much smaller (e.g., between 0.1 and 0.5 mm). Although very thin, base 902 can effectively prevent the encapsulant from entering the through hole during lamination.

Figure 9B:
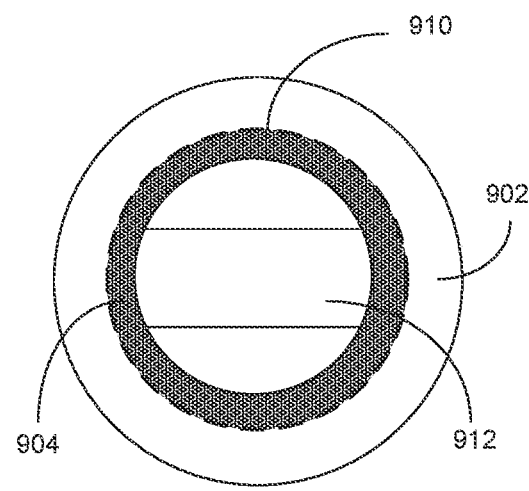
FIG. 9B shows the top view of the exemplary gasket inserted into a through hole on the back cover, according to one embodiment.

FIG. 9B shows the top view of the exemplary gasket inserted into a through hole on the back cover, according to one embodiment. In FIG. 9B, dashed circle 910 indicates a through hole created on a back cover of a PV tile module. The gasket can be inserted into through hole 910 from the interior surface of the back cover; as a result, body 904 of the gasket can snugly fit into through hole 910, whereas base 902 of the gasket can be in contact with the interior surface of the back cover. FIG. 9B also shows pre-laid circuit component 912 partially exposed by through hole 910.

Once the gasket is inserted into the through hole, a metallic plug can be placed into the center hole of body 904. The metallic plug can have a cylindrical shape with its diameter substantially similar to the inner diameter of body 904 and its height slightly larger than that of body 904. Therefore, the metallic plug can fill the center hole of body 904 and create a metal-to-metal contact between the metallic plug and pre-laid circuit 912. In some embodiments, the metallic plug can be made of Cu.

Figure 10A:
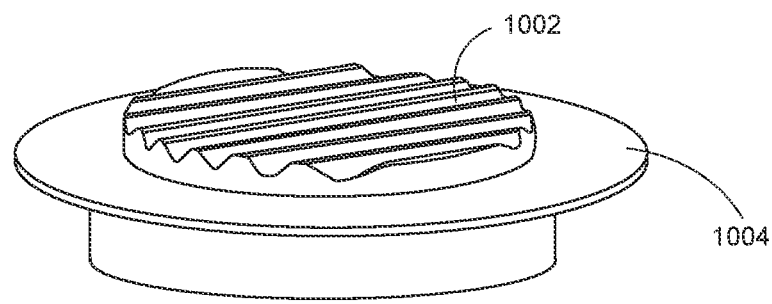
FIG. 10A shows a metallic plug inserted into a gasket, according to one embodiment.

FIG. 10A shows a metallic plug inserted into a gasket, according to one embodiment. In FIG. 10A, metallic plug 1002 snugly fits into the center hole of gasket 1004. Because the height of metallic plug 1002 is larger than that of gasket 1004, a portion of metallic plug 1002 extrudes out of gasket 1004. The extruded portion of metallic plug 1002 can then be in contact with the pre-laid circuit on the back cover.

Figure 10B:
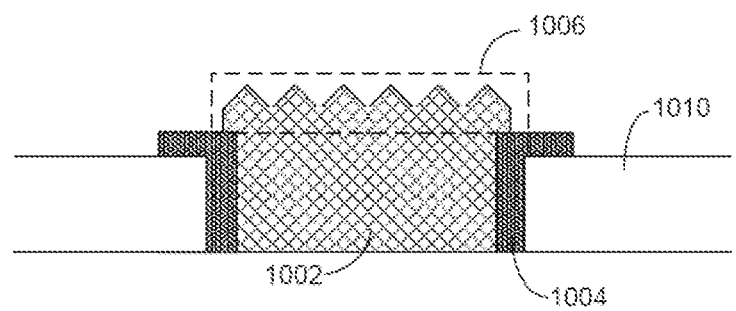
FIG. 10B shows the cross-sectional view of the metallic plug and gasket, according to one embodiment.

FIG. 10B shows the cross-sectional view of the metallic plug and gasket, according to one embodiment. More specifically, FIG. 10B shows that the metallic plug 1002 can include a crown section 1006, whose diameter is slightly larger than the body of metallic plug 1002. The body of metallic plug 1002 can be cylindrically shaped with a diameter substantially similar to that of the center hole of gasket 1004 such that the body of metallic plug 1002 can snugly fit inside gasket 1004. On the other hand, because of its larger diameter, crown section 1006 can rest on the inner edge of gasket 1004. This way, after lamination, metallic plug 1002 can be securely sealed inside the PV tile module and will not fall through the center hole of gasket 1004.

FIG. 10B also shows back cover 1010, which has a through hole at a desired location. In some embodiments, back cover 1010 can made be made of tempered glass. Gasket 1004 fits inside the through hole, and metallic plug 1002 fits inside gasket 1004. Metallic plug 1002 can be flush with the exterior surface (e.g., the surface facing the outside of the tile module) of back cover 1010, thus facilitating easy access to the internal circuit of the tile module. Moreover, both metallic plug 1002 and gasket 1004 can be placed from the interior surface (e.g., the surface facing the inside of the tile module) of back cover 1010. Therefore, after lamination, metallic plug 1002 and gasket 1004 can be securely sealed inside the tile module.

In the example shown in FIGS. 10A-10B, the interior surface of the metallic plug (i.e., the surface that will come into contact with the internal circuit of the tile module) can be textured with grooves and ridges. This texture can enhance the reliability of the metal-to-metal contact between the metallic plug and the internal circuit (e.g., a metallic strip) of the tile module. This is due to the existence of the encapsulant, which can be flexible. As a result, the interface between the metallic plug and the internal circuit may experience deformation under pressure. A smooth and flat surface may not ensure sufficient contact. On the other hand, the texture can increase the contact area when the textured surface is pressed against the surface of the internal circuit (e.g., a metallic strip), thus ensuring a more reliable electrical coupling. In some embodiments, other than establishing a connection to a metal strip attached to the back cover, the metallic plug may come into direct contact with the back surface bridge electrode, which is also part of the internal circuit of the tile module.

In addition to the array of ridges and grooves shown in FIGS. 10A-10B, the texture on the metallic plug can have other shapes, including but not limited to arrays of: triangular pyramids, square pyramids, hexagonal pyramids, cones, etc. In addition to the regular array format shown in FIGS. 10A-10B, the textured surface of the metallic plug can also include randomly distributed shapes.

Figure 10C:
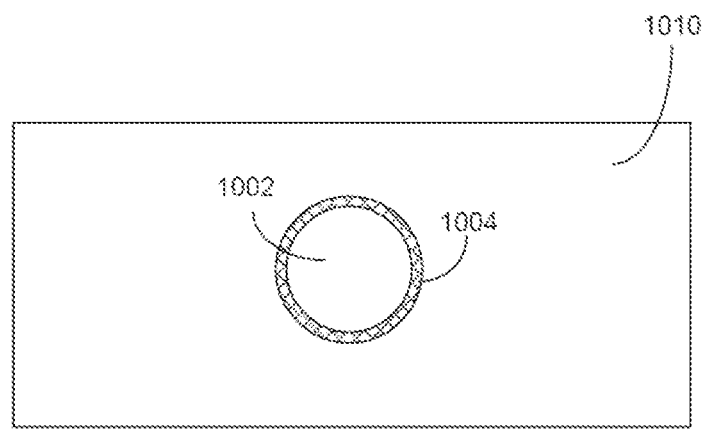
FIG. 10C shows the bottom view of the metallic plug and gasket, according to one embodiment.

FIG. 10C shows the bottom view of the metallic plug and gasket, according to one embodiment. In FIG. 10C, the bottom surface of metallic plug 1002 can be exposed to the external world of the tile module via a through hole on back cover 1010. Because metallic plug 1002 is electrically coupled to the internal circuit inside the tile module, electrical coupling with the internal circuit of the tile module can be achieved by establishing coupling with metallic plug 1002. As discussed before, metallic plug 1002 is flush with the bottom surface of back cover 1010, making it relatively easy to establish electrical coupling with any external circuit component (e.g., a circuit component in a junction box). In other words, metallic plug 1002 can serve as an external electrode of the tile module. In some embodiments, each tile module can include two metallic plugs on its back cover, one for each polarity.

Note that, in the examples shown in FIGS. 10A-10C, the through hole is shown as circular and the metallic plug is shown as two stacked concentric cylinders. In practice, the through hole and the metallic plug may have other shapes, such as rectangular prism or hexagonal prism, as long as the metallic plug can fit inside the through hole, with one surface in contact with the internal circuit of the tile module and the other surface substantially flush with the exterior surface of the back cover. Moreover, the gasket can facilitate the fitting of the metallic plug and can prevent the overflow of the encapsulant. However, it is also possible to omit the gasket and rely on the metallic plug to prevent the overflow of the encapsulant. For example, by increasing the diameter and height of the crown section of the metallic plug, one may prevent the encapsulant from contaminating the interface between the metallic plug and the internal circuit.

Figure 11:
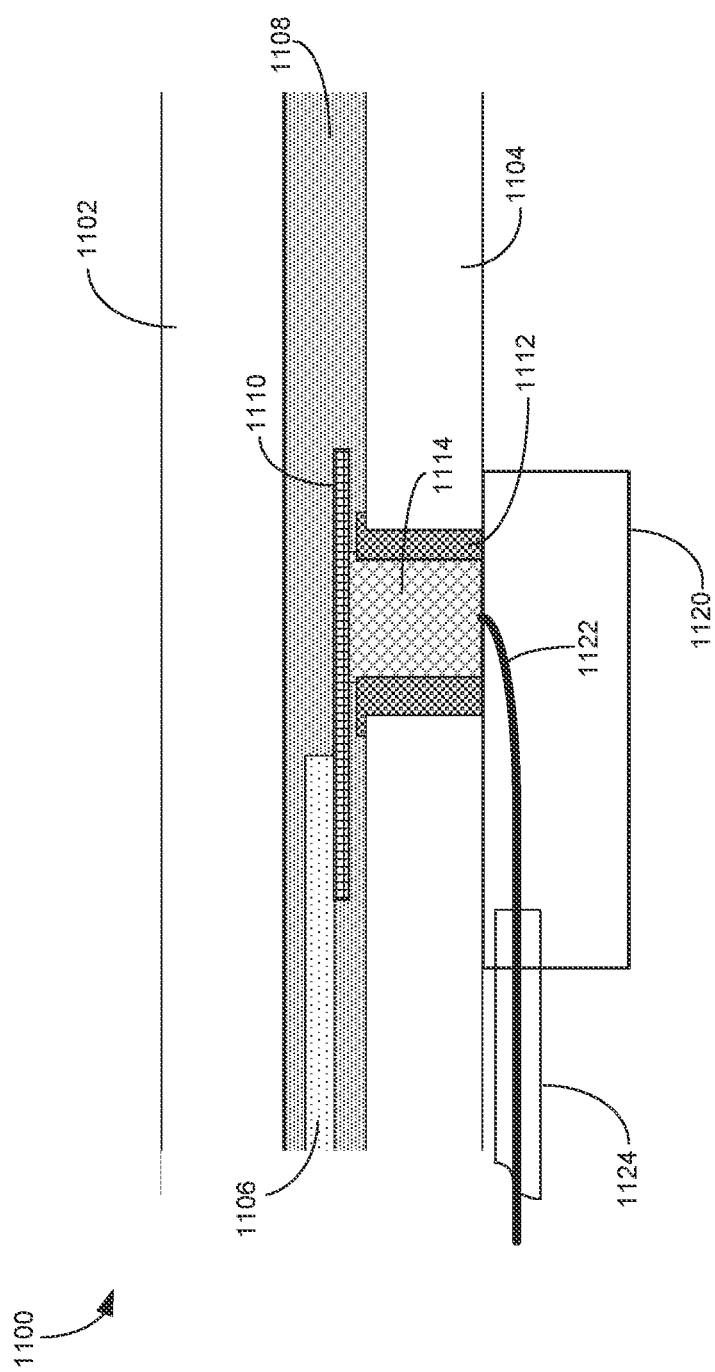
FIG. 11 shows the coupling between a junction box and a solar roof tile module, according to one embodiment.

FIG. 11 shows the coupling between a junction box and a solar roof tile module, according to one embodiment. In FIG. 11, solar roof tile module 1100 can include a front cover 1102, a back cover 1104, and one or more cascaded strings 1106 embedded in encapsulant 1108 and sandwiched between front cover 1102 and back cover 1104. Cascaded string 1106 can be electrically coupled to an internal circuit component 1110. Depending on the design, internal circuit component 1110 may have different forms. For example, internal circuit component 1110 can be a standalone metallic strip placed during the assembling process of the solar roof tile module 1100 or a metallic strip attached onto back cover 1104 prior to the assembling process. In some embodiments, internal circuit component 1110 can be coupled to an edge busbar of cascaded string 1106 or a bridge electrode coupled to an edge busbar of cascaded string 1106. The coupling between internal circuit component 1110 and cascaded string 1106 can be achieved via conductive paste or conductive film.

Back cover 1104 can include a through hole and gasket 1112 can be placed inside the through hole. Metallic plug 1114 can then be placed into gasket 1112. The location of the through hole can be carefully designed such that, once placed inside gasket 1112, metallic plug 1114 can come into direct contact with internal circuit component 1110.

FIG. 11 also shows that a junction box 1120 can be attached to the exterior surface of back cover 1104, directly above the through hole, and hence, above the metallic plug. Junction box 1120 can be weatherproof, thus capable of protecting metallic plug 1114 from exposure to weather factors (e.g., moisture). Junction box 1120 can include a lead wire 1122 that can be coupled to metallic plug 1114. An electrical path that includes lead wire 1122, metallic plug 1114, and internal circuit 1110 can be established. As a result lead wire 1122 can be coupled to cascaded string 1106, serving as an electrode for cascaded string 1106. For simplicity of illustration, FIG. 11 does not show the detail about the coupling between lead wire 1122 and metallic plug 1114. Various coupling mechanisms, such as soldering, applying an adhesive, using a spring-loaded clip, etc., can be used to couple lead wire 1122 and metallic plug 1114. For example, metallic plug 1114 can include a small indentation on its exposed surface. The indentation can be pre-filled with solder and a cold solder technique can be used to solder lead wire 122 to metallic plug 1114. Before exiting junction box 1120, lead wire 1122 can be inserted into weatherproof jacket 1124, which can protect lead wire 1122 from weather elements. In some embodiments, lead wire 1122 can also include, on the other end, a cable coupler, thus facilitating coupling between lead wire 1122 and a lead wire from a different tile module. Other junction box components, such as bypass diodes, are not shown in FIG. 11.

Figure 12A:
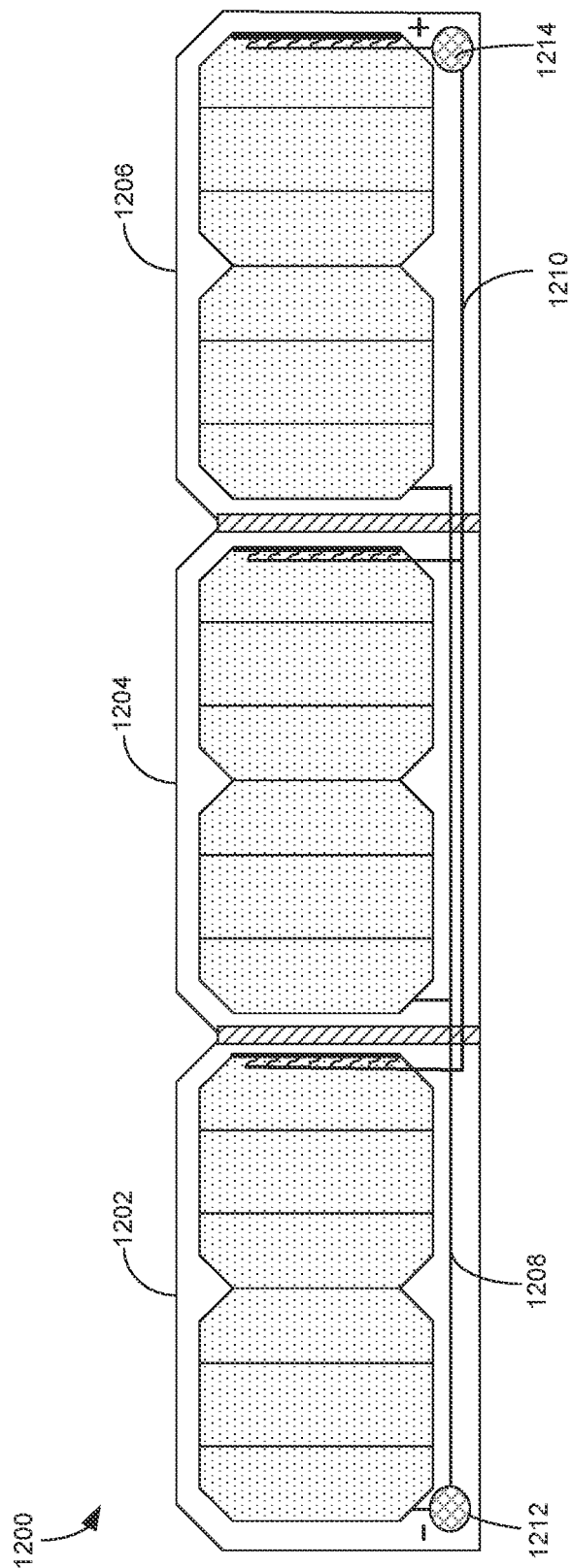
FIG. 12A shows the bottom view of an exemplary multi-tile module, according to one embodiment of the present invention.

FIG. 12A shows the bottom view of an exemplary multi-tile module, according to one embodiment of the present invention. Multi-tile module 1200 can include three PV tiles 1202, 1204, and 1206. In some embodiments, PV tiles 1202, 1204, and 1206 can be coupled electrically in parallel to each other via metal tabs 1208 and 1210. For example, metal tab 1208 can be coupled to negative-polarity busbars (e.g., the front-side busbars) of all the PV tiles within the module, whereas metal tab 1210 can be coupled to positive-polarity busbars (e.g., the back-side busbars) of all the PV tiles. Multi-tile module 1200 can also include metallic plugs 1212 and 1214, both positioned in through holes formed on the back cover of multi-tile module 1200. Metallic plug 1212 can be electrically coupled to metallic strip 1208, and metallic plug 1214 can be electrically coupled to metallic strip 1210. As a result, metallic plugs 1212 and 1214 can serve as the negative and positive polarity electrodes, respectively, of multi-tile module 1200. Any electrical coupling between multi-tile module 1200 and any other tile modules can be achieved via metallic plugs 1212 and 1214.

Figure 12B:
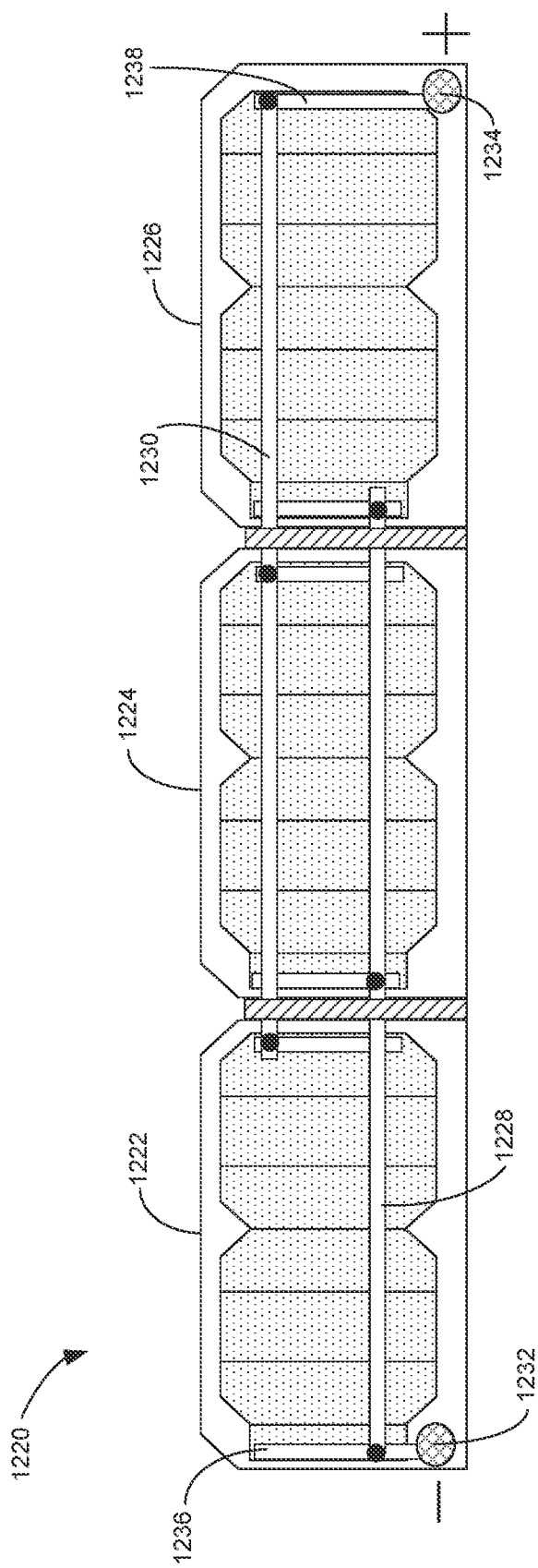
FIG. 12B shows the bottom view of another exemplary multi-tile module, according to one embodiment of the present invention.

FIG. 12B shows the bottom view of another exemplary multi-tile module, according to one embodiment of the present invention. In the example shown in FIG. 12B, multi-tile module 1220 can include three PV tiles 1222, 1224, and 1226. Multi-tile module 1220 can also include a pre-laid circuit attached to the back covers of the PV tiles. The pre-laid circuit can include pre-laid metallic strips 1228 and 1230. In this example, pre-laid metallic strips 1228 and 1230 can electrically couple PV tiles 1222, 1224, and 1226 in parallel. More specifically, metallic strip 1228 can be coupled to, via corresponding bridge electrodes, negative-polarity busbars (e.g., the front-side busbars) of all the PV tiles within the module, whereas metallic strip 1230 can be coupled to positive-polarity busbars (e.g., the back-side busbars) of all the PV tiles. Multi-tile module 1220 can also include metallic plugs 1232 and 1234, both positioned in through holes formed on the back cover of multi-tile module 1220. Metallic plug 1232 can be electrically coupled to metallic strip 1228 via vertical metallic strip 1236, and metallic plug 1234 can be electrically coupled to metallic strip 1230 via vertical metallic strip 1238. As a result, metallic plugs 1232 and 1234 can serve as the negative and positive polarity electrodes, respectively, of multi-tile module 1220. Any electrical coupling between multi-tile module 1220 and any other tile modules can be achieved via metallic plugs 1232 and 1234.

Figure 13A:
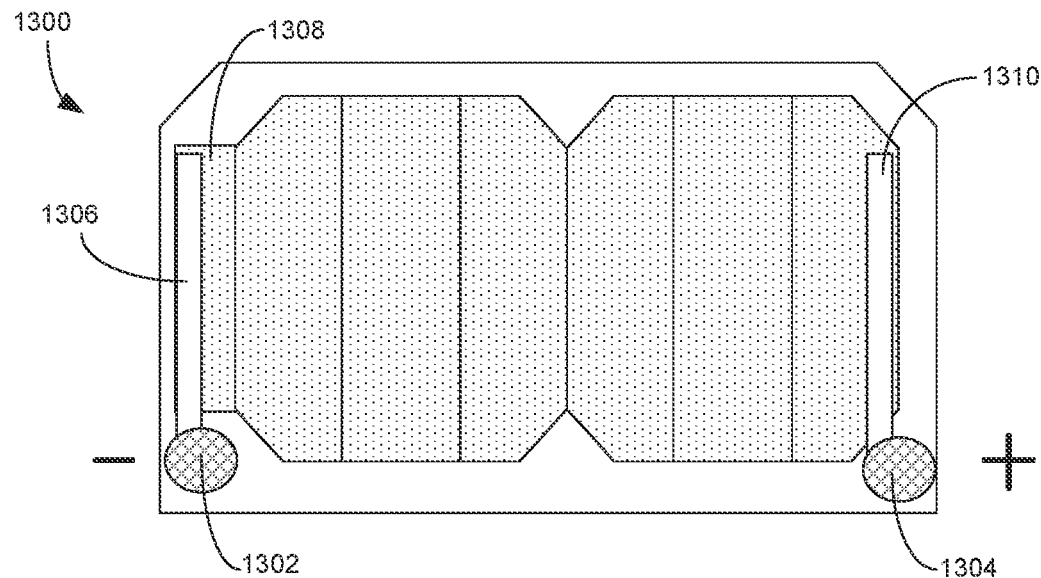
FIG. 13A shows the bottom view of an exemplary single-tile module, according to one embodiment of the present invention.

In the examples shown in FIGS. 12A-12B, the solar roof tile modules are multi-tile modules, i.e., multiple PV roof tiles are coupled to each other via tile spacers to form a single module. The multi-tile module can include a single set of external electrical contacts (e.g., metallic plugs 1212 and 1214, or metallic plugs 1232 and 1234) that can be used as electrical coupling to other tile modules. The multi-tile module can be viewed as a single battery with a positive electrode and a negative electrode, like any other type of battery. In addition to multi-tile modules, in some embodiments, a tile module can include a single PV tile, as shown in FIG. 13A. FIG. 13A shows the bottom view of an exemplary single-tile module, according to one embodiment of the present invention. In FIG. 13A, tile module 1300 is a single-tile module that includes a cascaded string encapsulated between a front and back cover. Tile module 1300 can include on its back cover metallic plugs 1302 and 1304. Metallic plug 1302 can be coupled to the front-side edge busbar of the cascaded string via metallic strip 1306 on bridge electrode 1308. Metallic plug 1304 can be coupled to the back-side edge busbar of the cascaded string via metallic strip 1310.

Figure 13B:
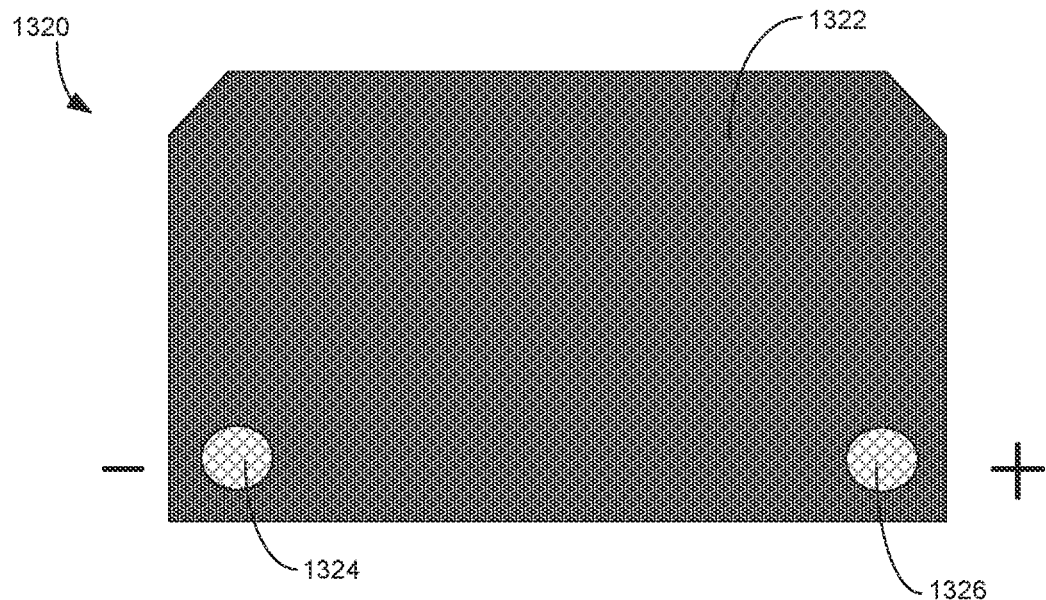
FIG. 13B shows the bottom view of an exemplary single-tile module with an opaque back cover, according to one embodiment of the present invention.

Similar to the examples shown in FIGS. 12A-12B, single-tile module 1300 can now be viewed as a battery with positive and negative electrodes (i.e., electrodes 1304 and 1302) that can enable electrical coupling between tile module 1300 and other tile modules. In the examples shown in FIGS. 12A-12B and FIG. 13, for illustration purposes, the back covers of the tile modules are shown as transparent to reveal components (e.g., cascaded strings and pre-laid circuits) encapsulated within the tile modules. In practice, the back cover can be painted a dark color in order to match the color of the photovoltaic structures. In such scenarios, the back cover of a PV tile module can be opaque, as shown in FIG. 13B, which shows the bottom view of an exemplary single-tile module with an opaque back cover, according to one embodiment of the present invention. In FIG. 13B, tile module 1320 can include an opaque back cover 1322. Metallic plugs 1324 and 1326 positioned in through holes formed on back cover 1322 can serve as external electrical contacts for tile module 1320.

Figure 14:
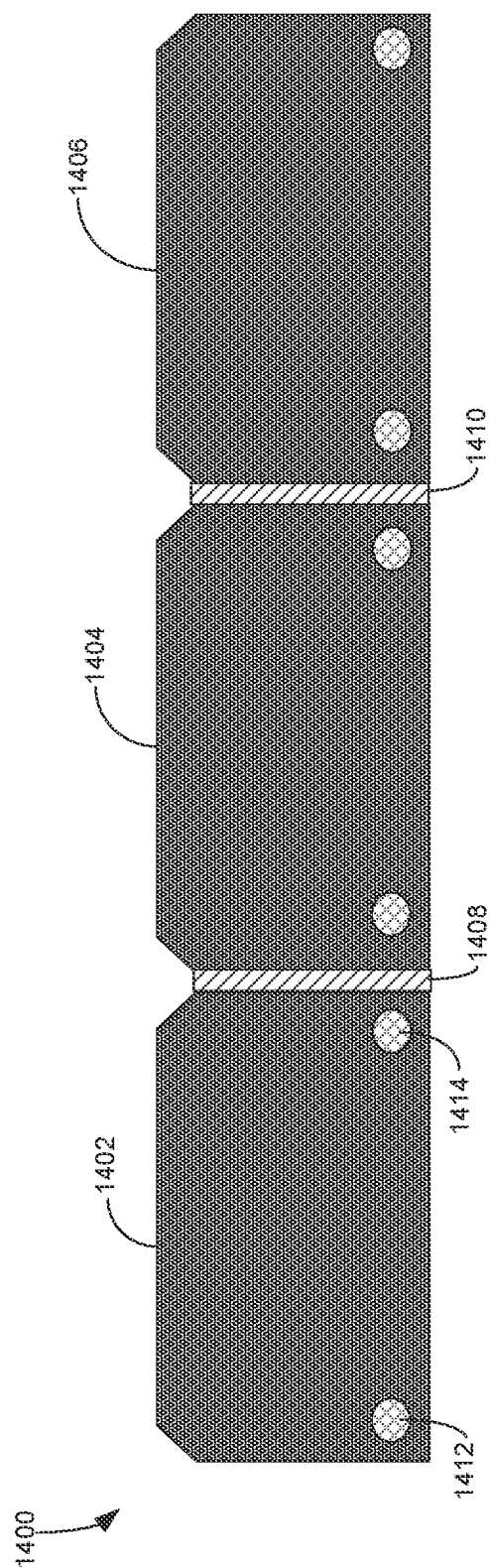
FIG. 14 shows the bottom view of an exemplary multi-tile module, according to one embodiment of the present invention.

In some embodiments, it is also possible for a multi-tile module to have an external electrical connector on each tile. FIG. 14 shows the bottom view of an exemplary multi-tile module, according to one embodiment of the present invention. In FIG. 14, multi-tile module 1400 can include PV tiles 1402, 1404, and 1406 that are coupled to each other by tile spacers 1408 and 1410. Each tile can include a pair of external electrical contacts. For example, tile 1402 can include electrical contacts 1412 and 1414. Because each tile has its own external contacts, there is no longer a need to establish inter-tile electrical coupling via the spacers. As a result, the spacer design can be significantly simplified. Moreover, installing external electrical contacts on each tile can also enable more flexible electrical coupling among the tiles. Various forms of electrical coupling (including in-series, in-parallel, or both) can be achieved by designing the coupling among those external electrical contacts. Such couplings can be achieved via junction boxes or simple weather-protected cables.

Fabrication of a Photovoltaic Roof Tile Module

Figure 15:
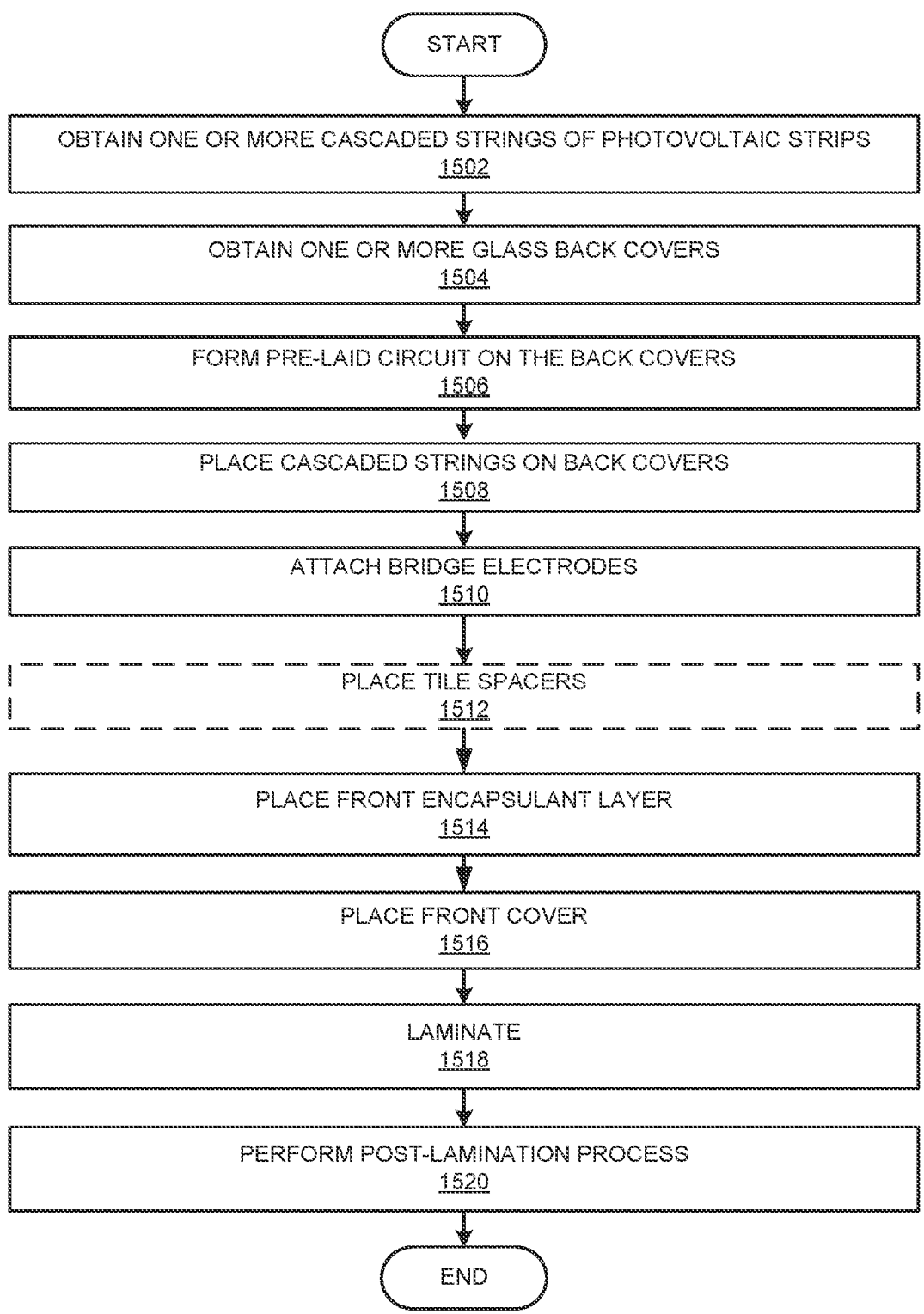
FIG. 15 presents a flowchart illustrating an exemplary process for fabricating a photovoltaic roof tile module, according to an embodiment.

FIG. 15 presents a flowchart illustrating an exemplary process for fabricating a photovoltaic roof tile module, according to an embodiment. The photovoltaic tile module can be a multi-tile module that includes multiple individual photovoltaic roof tiles coupled to each other via tile spacers or a single-tile module.

During fabrication, one or more cascaded strings of photovoltaic strips can be obtained (operation 1502). The photovoltaic strips can be obtained by dividing a standard square or pseudo-square solar cell into multiple pieces; and a string of strips can be formed by cascading multiple strips at the edges. The cascading forms a serial connection among the strips. In some embodiments, each individual solar roof tile may include one string, and each string can include six cascaded strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, instead of conductive paste, electrical and mechanical bonding between the adjacent strips at their corresponding edges can be achieved via adhesive conductive films. Detailed descriptions about the bonding of adjacent photovoltaic strips using adhesive conductive films can be found in U.S. patent application Ser. No. 16/007,599, entitled "CASCADED SOLAR CELL STRING USING ADHESIVE CONDUCTIVE FILM," filed Jun. 13, 2018, the disclosure of which is incorporated herein by reference in its entirety.

One or more glass back covers for solar roof tiles can be prepared (operation 1504). In some embodiments, preparing the glass back covers can include creating one or more through holes at desired locations on the glass back covers and inserting a gasket and a metallic plug (e.g., a Cu plug) inside each through hole. In some embodiments, adhesive can be used to secure the gasket and metallic plug. Alternatively, they can fit snugly together without the need to apply adhesive.

A pre-laid circuit can be formed on the back covers (operation 1506). In some embodiments, the pre-laid circuit can be formed by attaching (e.g., using an adhesive) individual metallic strips at desired locations on the back covers. To prevent unwanted electrical coupling, a metallic strip running across multiple cascaded strips or even multiple tiles can be wrapped by an insulation film with openings at one or more desired locations. In alternative embodiments, the pre-laid circuit can be formed by printing, or depositing using other metallization techniques (e.g., evaporation, sputtering, plating, etc.) metallic traces at desired locations on the interior surface of the back covers. Similarly, a metallic trace that runs across multiple cascaded strips can be covered by an insulation film with one or more openings formed at desired locations. The pre-laid circuit can be configured in such a way that the metallic strips or traces can be positioned on top of the metallic plugs, creating metal-to-metal contacts.

The previously prepared cascaded strings can then be placed onto the back covers (operation 1508). In some embodiments, a robotic arm with vacuum-enabled wafer pickers can pick up the cascaded strings and lay them on desired locations of the back covers. The cascaded strings should be arranged in such a way that the bottom edge busbar of a cascaded string overlaps a corresponding metallic strip or trace of the pre-laid circuit. Various alignment techniques (e.g., laser vision or computer vision) can be used to align the cascaded string. The coupling between the metallic strip or trace in the pre-laid circuit and the edge busbar of the cascaded string can be achieved using electrically conductive adhesive (ECA). Alternatively, no adhesive is needed because the rigid coupling between the front and back glass covers can sufficiently secure the metal-to-metal contact. Note that, in some embodiments, prior to laying down the cascaded strings, a back encapsulant layer can be placed on the back covers having the pre-laid circuit. This operation is not shown in FIG. 15. To ensure proper electrical coupling between the pre-laid circuit and the subsequently laid cascaded strings, the back encapsulant layer does not cover the metallic strips or traces that need to be coupled to the electrodes of the cascaded strings. To do so, openings can be created on the back encapsulant layer or the back encapsulant layer can be smaller than the back cover and cover only the center portion, leaving the bordering regions, including those metallic strips needing to couple to the cascaded strings, uncovered.

Subsequently, a bridge electrode can be attached to each cascaded string (operation 1510). More specifically, an edge of the back surface of the bridge electrode can stack on the top edge busbar of the cascaded string. If the bridge electrode includes an edge busbar on its back surface, such an edge busbar can overlap the top edge busbar of the cascaded string in a way similar to the cascading of two adjacent strips. Moreover, the contact pads on the other edge of the back surface can overlap a corresponding metallic strip or trace of the pre-laid circuit. The coupling between the bridge electrode and the edge busbar of a cascaded string can be similar to the coupling between two adjacent photovoltaic structures, which can involve a conductive paste. On the other hand, the coupling between the contact pads of the bridge electrode and the pre-laid circuit can be similar to the coupling between the bottom edge busbar of the cascaded string and the pre-laid circuit, which can involve ECA. In addition, it is also possible to not use adhesive at all, but to rely instead on the metal-to-metal contact for electrical coupling.

In some embodiments, tile spacers can be placed between adjacent tiles within the tile module (operation 1512). This operation is optional, because the tile spacers are not needed for single-tile modules.

Subsequently, a front encapsulant layer can then be placed on top of the cascaded string and the bridge electrode (operation 1514), and front glass covers can be placed on top of the front encapsulant layer (operation 1516). A lamination operation can be performed to encapsulate the cascaded strings along with the bridge electrodes between the front and back covers (operation 1518). A post-lamination process (e.g., trimming of overflowed encapsulant and attachment of the junction box and other roofing components) can then be performed to complete the fabrication of a PV roof tile (operation 1520). In some embodiments, a pair of junction boxes may be needed to access the pair of external electrical contacts (metallic plugs) on the back cover of the tile module. In other embodiments, a simpler design (e.g., a weather-protected cable) can be used to couple to the external electrical contacts to enable inter-module electrical coupling.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof tile module, comprising at least:
   a front cover;
   a back cover defining a through hole;
   a gasket disposed within and filling the through hole, wherein the gasket defines a central hole extending through the gasket;
   a metallic plug closing the central hole and comprising a first surface and a second surface opposite the first surface and wherein the metallic plug comprises a crown section that includes the first surface and wherein a diameter of the crown section is greater than a diameter of the central hole;
   a plurality of photovoltaic structures positioned between the front cover and the back cover;
   an internal circuit component electrically coupled to the plurality of photovoltaic structures, wherein the internal circuit component is positioned between the front cover and the back cover; and
   wherein the first surface of the metallic plug is electrically coupled to the internal circuit component, and wherein the second surface of the metallic plug is exposed to surroundings external to the photovoltaic roof tile module.

2. The photovoltaic roof tile module of claim 1, wherein a respective photovoltaic structure comprises a first edge busbar positioned near an edge of a first surface and a second edge busbar positioned near an opposite edge of a second surface, and wherein the plurality of photovoltaic structures are arranged in such a way that the first edge busbar of a first photovoltaic structure overlaps the second edge busbar of an adjacent photovoltaic structure, thereby forming a cascaded string that comprises the plurality of photovoltaic structures coupled to each other in series.

3. The photovoltaic roof tile module of claim 2, wherein the internal circuit component comprises one of:
   a standalone metallic strip electrically coupled to an edge busbar of the cascaded string; or
   a metallic strip pre-laid onto an interior surface of the back cover.

4. The photovoltaic roof tile module of claim 1, wherein the second surface of the metallic plug is flush with an exterior surface of the back cover.

5. The photovoltaic roof tile module of claim 1, wherein the first surface of the metallic plug is in direct contact with the internal circuit component.

6. The photovoltaic roof tile module of claim 5, wherein the first surface of the metallic plug is textured to ensure a sufficient contact area between the first surface of the metallic plug and the internal circuit component.

7. The photovoltaic roof tile module of claim 1, wherein the metallic plug is configured in such a way that a portion of the metallic plug is slightly larger than the central hole, thus preventing the metallic plug from slipping through the central hole.

8. The photovoltaic roof tile module of claim 1, further comprising a junction box attached to the back cover, wherein the junction box covers the through hole and includes a lead wire coupled to the second surface of the metallic plug.

9. The photovoltaic roof tile module of claim 1, further comprising:
   a layer of encapsulant disposed between the front cover and the back cover, wherein the gasket comprises a lip that extends radially outward from an end of the gasket into an area between the front cover and the back cover to prevent a portion of the layer of encapsulant from flowing into the through hole.

10. The photovoltaic roof tile module of claim 1, wherein the gasket extends from a first end of the through hole to a second end of the through hole opposite the first end.

11. The photovoltaic roof tile module of claim 1, further comprising a layer of encapsulant disposed between the front cover and the back cover.

12. The photovoltaic roof tile module of claim 1, wherein a body portion of the metallic plug that is disposed within the central hole has a smaller diameter than the crown section.

13. The photovoltaic roof tile module of claim 1, wherein the first surface is textured with grooves and ridges to enhance a reliability of a metal-to-metal contact between the metallic plug and the internal circuit component.

14. The photovoltaic roof tile module of claim 1, wherein the gasket comprises a cylindrical body and a base, wherein the base has a larger diameter than the cylindrical body.

15. The photovoltaic roof tile module of claim 1, wherein the metallic plug entirely fills the central hole extending through the gasket.

* * * * *